(12) United States Patent
Zeng

(10) Patent No.: US 11,043,652 B2
(45) Date of Patent: Jun. 22, 2021

(54) DISPLAY PANEL WITH QUANTUM DOT THIN FILM

(71) Applicant: Shenzhen China Star Optoelectronics Semiconductor Display Technology Co., Ltd., Guangdong (CN)

(72) Inventor: Weijing Zeng, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 20 days.

(21) Appl. No.: 16/621,243

(22) PCT Filed: Nov. 12, 2019

(86) PCT No.: PCT/CN2019/117378
§ 371 (c)(1),
(2) Date: Dec. 11, 2019

(87) PCT Pub. No.: WO2021/027141
PCT Pub. Date: Feb. 18, 2021

(65) Prior Publication Data
US 2021/0050551 A1    Feb. 18, 2021

(51) Int. Cl.
*H01L 51/52*    (2006.01)
*H01L 27/32*    (2006.01)

(52) U.S. Cl.
CPC ........ *H01L 51/5253* (2013.01); *H01L 27/322* (2013.01); *H01L 27/3246* (2013.01); *H01L 27/3248* (2013.01); *H01L 51/5218* (2013.01); *H01L 51/5271* (2013.01); *H01L 2251/5369* (2013.01)

(58) Field of Classification Search
CPC combination set(s) only.
See application file for complete search history.

(56) References Cited

U.S. PATENT DOCUMENTS

2007/0126358 A1*  6/2007  Okutani ................. B82Y 30/00
                                                    313/512
2010/0194717 A1*  8/2010  Mori .................... H01L 51/5268
                                                    345/204

(Continued)

FOREIGN PATENT DOCUMENTS

CN    101800241 A    8/2010
CN    104466010 A    3/2015

(Continued)

*Primary Examiner* — Nduka E Ojeh
(74) *Attorney, Agent, or Firm* — Mark M. Friedman

(57) ABSTRACT

The present invention provides a display panel including a light emitting diode structure. The light emitting diode structure includes an anode located on a thin film transistor layer, a light emitting material layer located on the anode, and a cathode covering the light emitting material layer. The light emitting diode structure further includes an anode reflective layer and a quantum dot thin film. The anode reflective layer is located under the anode, and is electrically insulated from the anode through a reflective insulation layer. The quantum dot thin film is located between the anode and the anode reflective layer.

11 Claims, 3 Drawing Sheets

(56) References Cited

U.S. PATENT DOCUMENTS

2016/0190515 A1* 6/2016 Huang ................ H01L 51/5271
                                                     257/13
2018/0211979 A1   7/2018 Lee et al.
2019/0310522 A1* 10/2019 Chu .................. G02F 1/133617

FOREIGN PATENT DOCUMENTS

| CN | 104576703 A | 4/2015 |
|----|-------------|--------|
| CN | 108346681 A | 7/2018 |
| CN | 108983490 A | 12/2018 |
| CN | 109721692 A | 5/2019 |
| JP | 2008218328 A | 9/2008 |

* cited by examiner

DISPLAY PANEL WITH QUANTUM DOT THIN FILM

FIELD OF INVENTION

The present invention relates to a field of electronic displays, especially to a display panel.

BACKGROUND OF INVENTION

Organic light emitting diode (OLED) display panels have characteristics of self-luminescence, high brightness, wide view angle, high contrast, flexibility, and low energy consumption, and are therefore applied extensively to mobile phone screens, displays, monitors, and color televisions.

Technical Issue

An anode of a top emission organic light emitting diode (OLED) structure generally employs a structure constructed by indium tin oxide (ITO) and silver (Ag). To match energy levels of the anode and the organic light emitting material, a material of the anode directly contacting the organic material is the ITO. Furthermore, because the anode needs to serve as a reflective electrode, the anode needs to be disposed with metal with a high reflectivity, for example, Ag.

However, Ag easily oxidizes in the air to form oxidized silver bumps, which results in that shorting of the anode and the cathode of OLED device to cause pixels to be unable to emit light and thus influences quality of displayed images.

SUMMARY OF INVENTION

Technical Solution

The present invention provides a display panel to solve the issue of abnormal display due to anode oxidization in in the prior art.

To solve the above issue, the present invention provides a display panel comprising: a substrate, a thin film transistor layer, and a light emitting diode structure; the light emitting diode structure comprises:

an anode, the anode located on the thin film transistor layer, and electrically connected to the thin film transistor layer;

a light emitting material layer located on the anode; and a cathode covering the light emitting material layer;

the light emitting diode structure further comprising an anode reflective layer, the anode reflective layer located under the anode and electrically insulated from the anode through a reflective insulation layer; and a quantum dot thin film located between the anode and the anode reflective layer.

According to one aspect of the present invention, material of the anode is indium tin oxide, aluminum-doped zinc oxide, fluorine-doped tin oxide, or a combination of any two or more thereof.

According to one aspect of the present invention, material forming the anode reflective layer is silver, copper, aluminum, gold, iron, or a combination of any two or more thereof.

According to one aspect of the present invention, a surface of the anode reflective layer is a mirror surface structure.

According to one aspect of the present invention, the light emitting diode structure further comprises a pixel definition layer, the pixel definition layer covers the thin film transistor layer and comprises a first opening exposing the anode, and the light emitting material layer is located in the first opening.

According to one aspect of the present invention, the anode reflective layer and the light emitting material layer are disposed correspondingly, and a projection of the anode reflective layer on a light output surface of the display panel is greater than a projection of the light emitting material layer on the light output surface of the display panel.

According to one aspect of the present invention, the light emitting material layer further comprises a quantum dot definition layer located in the pixel definition layer and in the reflective insulation layer; wherein the quantum dot definition layer comprises a positioning through hole, and the quantum dot thin film is located in the positioning through hole.

According to one aspect of the present invention, the quantum dot thin film comprises:

a quantum dot material layer;

a barrier layer attached to two surfaces of the quantum dot material layer paralleling a light output surface of the display panel; and a protective layer attached to a surface of the barrier layer away from the quantum dot material layer.

According to one aspect of the present invention, a surface of the protective layer away from the quantum dot material layer comprises optical micro-nano structures.

According to one aspect of the present invention, a dimension of each of quantum dots in the quantum dot thin film corresponds to a color of light emitted from the light emitting material layer;

when the light emitted from the light emitting material layer is red, a diameter of each of the quantum dots is greater than or equal to 4 nm;

when the light emitted from the light emitting material layer is blue, the diameter of each of the quantum dots is less than or equal to 2 nm; and when the light emitted from the light emitting material layer is green, the diameter of each of the quantum dots is greater than or equal to 2.5 nm and is less than or equal to 3.5 nm.

According to one aspect of the present invention, the quantum dot material layer comprises high molecular polymer and quantum dots evenly distributed in the high molecular polymer; and the quantum dots comprise silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, or a combination of any two or more thereof.

Advantages

The anode of the display panel of the present invention is indium tin oxide, and is configured to match a work function of light emitting material in the light emitting material layer to improve light emitting efficiency of the display panel. At the same time, to enhance a use rate of light, the present invention disposes the anode reflective layer and the quantum dot thin film under the anode of the light emitting diode structure. Compared to the structure of the anode disposing the indium tin oxide and the reflective material together, the present invention effectively pixel failure due to oxidization of the reflective material. In the meantime, the present invention disposes the quantum dot thin film between the anode and the anode reflective layer, employs the quantum dot thin film to optimize reflected light. Compared the prior art of disposing the quantum dot thin film on the light output surface of the display panel, the present invention has a lower process complexity and facilitates mass production.

DETAILED DESCRIPTION OF PREFERRED EMBODIMENTS

Figure 1:
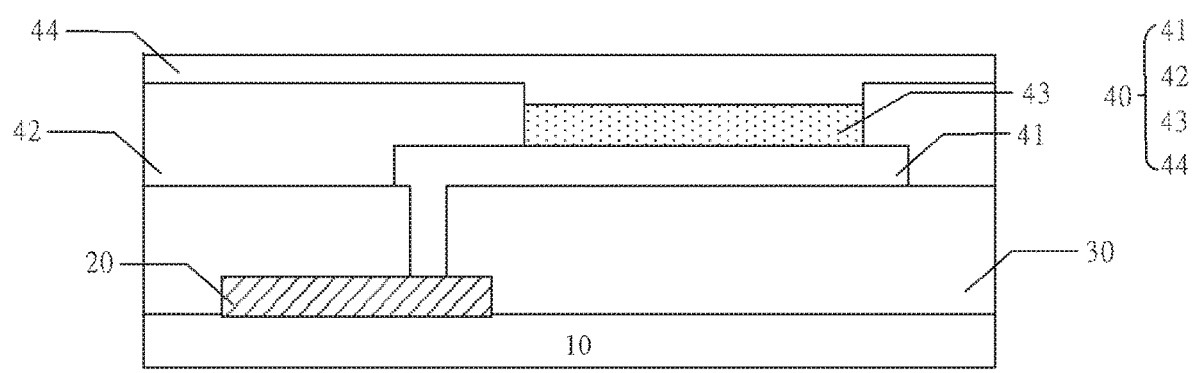
FIG. 1 is a schematic structural view of a conventional display panel.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

With reference to FIG. 1, FIG. 1 is a schematic structural view of a conventional display panel. The display panel is a top emission display panel. In other words, a light output surface of the display panel is a surface of a cathode of a light emitting diode structure away from an anode.

With reference to FIG. 1, the conventional display panel comprises a substrate 10, a thin film transistor 20, a planarization layer 30, and a light emitting diode structure 40. The light emitting diode structure 40 is located on the planarization layer, and comprises an anode 41, a pixel definition layer 42, a light emitting material layer 43, and a cathode 44. The anode 41 is located on the planarization layer 30, and is electrically connected to the thin film transistor 20 through a through hole. The pixel definition layer 42 covers the planarization layer 30, and has an opening exposing the anode 41. The light emitting material layer 43 is located in the opening, and the cathode 44 covers the light emitting material layer 43.

Because a surface of the cathode away from the anode is a light output surface, the cathode is a transparent electrode. In the meantime, to improve use rate of light, the anode is a reflective electrode. In the prior art, to match energy levels of the anode and the organic light emitting material, a material of the anode directly contacting the organic material is the ITO. Furthermore, because the anode needs to serve as a reflective electrode, the anode needs to be disposed with metal with a high reflectivity. Usually the material serving as the reflective material is Ag. Ag easily oxidizes in the air to form oxidized silver bumps, which results in that shorting of the anode and the cathode of OLED device to cause pixels to be unable to emit light and thus influences quality of displayed images.

Figure 2:
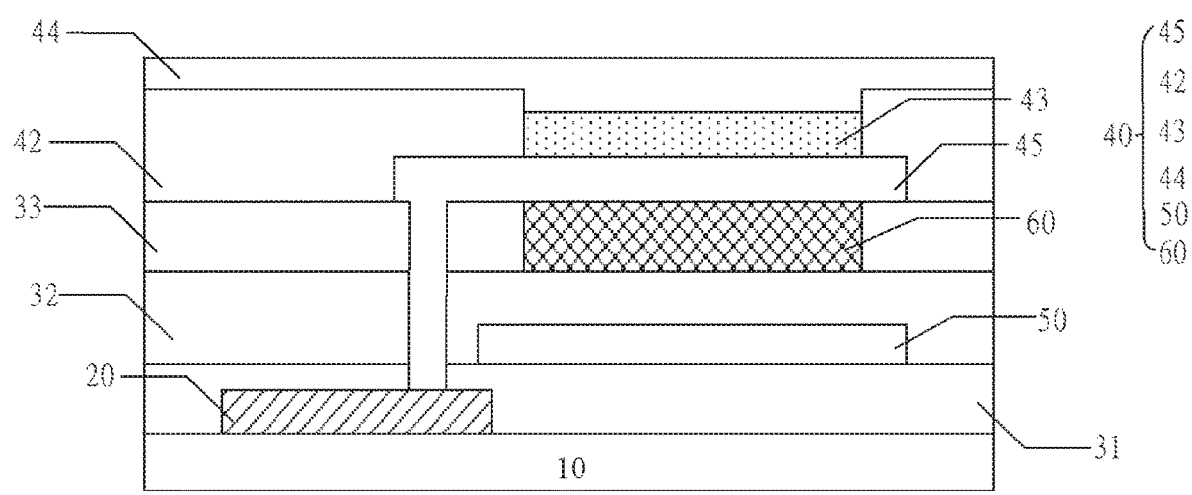
FIG. 2 is a schematic structural view of a display panel of a specific embodiment of the present invention.

To solve the above issue, the present invention provides a display panel. With reference to FIG. 2, the display panel comprises a substrate 10, a thin film transistor layer 20, and a light emitting diode structure 40. The light emitting diode structure 40 comprises an anode 45, a pixel definition layer 42, a light emitting material layer 43, a cathode 44, an anode reflective layer 50, and a quantum dot thin film 60.

The anode 45 is electrically connected to the thin film transistor 20 through a through hole. The pixel definition layer 42 covers the planarization layer 30, and comprises an opening exposing the anode 41. The light emitting material layer 43 is located in the opening, and the cathode 44 covers the light emitting material layer 43.

In the present invention, the anode 45 和 cathode 44 均為 light transmissive electrode. Materials forming the anode 45 and the cathode 44 are transparent conductive materials, for example indium tin oxide, aluminum-doped zinc oxide, fluorine-doped tin oxide, or a combination of any two or more thereof. The present invention employs a transparent material to form the anode 45 such that the reflective metal is stripped out from the anode 45. The transparent conductive material not only matches the light emitting material in work functions, but also prevents shorting of the anode 45 and the cathode 44 due to oxidized metal to further improve quality of the display panel.

Because the reflective metal is s stripped out from the anode 45, to maintain the use rate of light of the light emitting diode structure 40, the present invention disposes an anode reflective layer 50 in light emitting diode structure 40. In the present invention, material forming the anode reflective layer 50 is metal with a high reflectivity, for example, silver, copper, aluminum, gold, iron, or a combination of any two or more thereof. In the present embodiment, the material forming the anode reflective layer 50 is silver. Preferably, to enhance reflecting capability of the anode reflective layer to light, a surface of the anode reflective layer is a is a mirror surface structure. The mirror surface structure can minimize light loss caused by diffuse reflection and further improve the use rate of light in the light emitting diode structure. In the embodiment, the surface of the metal layer made by plating is a mirror structure, and preferably the anode reflective layer 50 is made by plating.

The anode reflective layer 50 is located under the anode 45, and is electrically insulated from the anode 45 through a reflective insulation layer 32. The reflective insulation layer 32 is disposed between an upper planarization layer 31 and the pixel definition layer 42. The material forming the reflective insulation layer 32 is an insulating material, for example, silicon nitride and silicon oxide. The reflective insulation layer 32 covers the anode reflective layer 50 and achieves electrical insulation between the anode 45 and the anode reflective layer 50.

In the present invention, to further improve a use rate of the reflected light, the display panel further comprises a quantum dot thin film 60 disposed the anode 45 and the anode reflective layer 50. With reference to FIG. 2, the quantum dot thin film 60 is located between the pixel definition layer 42 and the reflective insulation layer 32. In the present embodiment, to lower the cost, the quantum dot thin film 60 and the light emitting material layer 43 are disposed correspondingly. Specifically, the display panel comprises a quantum dot definition layer 33 disposed between the pixel definition layer 42 and the reflective insulation layer 32. The quantum dot definition layer 33 comprises a positioning through hole, the positioning through hole is located right under the light emitting material layer 43, and the quantum dot thin film 60 is filled in the positioning through hole.

In the present invention, the anode reflective layer 50, quantum dot thin film 60, and the light emitting material layer 43 are disposed correspondingly. Specifically, the anode reflective layer 50 and the quantum dot thin film 60 are located right under the light emitting material layer 43. In the meantime, to guarantee that the anode reflective layer can completely reflect light from light emitting diode structure 40 back to the light output surface, an area of each of the anode reflective layer 50 and the quantum dot thin film 60 is greater than an area of the light emitting material layer 43. In the present embodiment, a projection of the anode reflective layer 50 and a projection of the quantum dot thin film 60 on a light output surface of the display panel completely covers a projection of the light emitting material layer 43 on the light output surface of the display panel.

It should be understood by the above embodiment that the present invention strips and separately disposes the reflective metal and the transparent conductive material of the conventional reflective anode such that shorting of the anode and the cathode due to the oxidized reflective metal is prevented while reflection effect of the anode is guaranteed.

Figure 3:
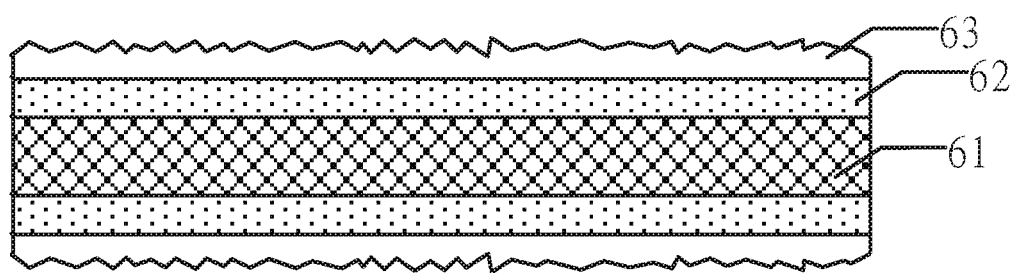
FIG. 3 is a schematic structural view of a quantum dot thin film of the display panel in FIG. 2.

With reference to FIG. 3, in the present embodiment, the quantum dot thin film 60 comprises a quantum dot material layer 61, a barrier layer 62, and a protective layer 63.

The quantum dot material layer 61 in one aspect can enhance light emitted from the light emitting material layer 43 toward the anode reflective layer 50, in another aspect can enhance light reflected from the anode reflective layer 50 towards the light output surface. Therefore, light emitted from the light emitting material layer toward an internal of the display panel is enhanced twice and then is emitted out from the light output surface of the display panel. Compared to the prior art, the present invention further improves light emitting efficiency of the light emitting diode structure 40, and optimizes display effect of the display panel.

In the present embodiment, the quantum dot material layer 61 comprises a high molecular polymer and quantum dots distributed evenly in the high molecular polymer. The quantum dots comprise silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, or a combination of any two or more thereof.

The barrier layer 62 is attached to two surfaces of the quantum dot material layer 61 paralleling a light output surface of the display panel. In the present embodiment, the barrier layer 62 is an inorganic protective film configured to prevent invasion of water and oxygen, for example, silicon dioxide film.

The protective layer 63 is attached to a surface of the barrier layer 62 away from the quantum dot material layer 61. The protective layer 63 is preferably acrylic material or polyethylene terephthalate (PET) with a high light transmittance.

With reference to FIG. 3, in the present embodiment, a surface of the protective layer 63 away from the quantum dot material layer 61 comprises optical micro-nano structures. The optical micro-nano structures are a plurality of irregular bumps and indentations, a height of each of the bumps and the indentations is no greater than 10 microns. The optical micro-nano structures can increase Newton rings, balance intensity and brightness of light, and simultaneously can increase returning paths of light to facilitate enhancement of light.

In the present invention, a dimension of each of the quantum dots in the quantum dot thin film 60 corresponds to a color of light emitted from the light emitting material layer 43. When the light emitted from the light emitting material layer 43 is red, a diameter of each of the quantum dots is greater than or equal to 4 nm. When the light emitted from the light emitting material layer 43 is blue, the diameter of each of the quantum dots is less than or equal to 2 nm. When the light emitted from the light emitting material layer 43 is green, the diameter of each of the quantum dots is greater than or equal to 2.5 n and is less than or equal to 3.5 nm.

Compared to the structure of the anode 45 disposing the indium tin oxide and the reflective material together, the present invention effectively pixel failure due to oxidization of the reflective material. In the meantime, the present invention disposes the quantum dot thin film between the anode and the anode reflective layer, employs the quantum dot thin film to optimize reflected light. Compared the prior art of disposing the quantum dot thin film on the light output surface of the display panel, the present invention has a lower process complexity and facilitates mass production.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A display panel, comprising: a substrate, a thin film transistor layer, and a light emitting diode structure, and the light emitting diode structure comprising:
    an anode, the anode located on the thin film transistor layer, and electrically connected to the thin film transistor layer;
    a light emitting material layer located on the anode; and
    a cathode covering the light emitting material layer;
    the light emitting diode structure further comprising an anode reflective layer, the anode reflective layer located under the anode and electrically insulated from the anode through a reflective insulation layer; and
    a quantum dot thin film located between the anode and the anode reflective layer.

2. The display panel as claimed in claim 1, wherein a material of the anode is indium tin oxide, aluminum-doped zinc oxide, fluorine-doped tin oxide, or a combination of any two or more thereof.

3. The display panel as claimed in claim 2, wherein a material forming the anode reflective layer is silver, copper, aluminum, gold, iron, or a combination of any two or more thereof.

4. The display panel as claimed in claim 3, wherein a surface of the anode reflective layer is a mirror surface structure.

5. The display panel as claimed in claim 1, wherein the light emitting diode structure further comprises a pixel definition layer, the pixel definition layer covers the thin film transistor layer and comprises a first opening exposing the anode, and the light emitting material layer is located in the first opening.

6. The display panel as claimed in claim 5, wherein the anode reflective layer and the light emitting material layer are disposed correspondingly, and a projection of the anode reflective layer on a light output surface of the display panel is greater than a projection of the light emitting material layer on the light output surface of the display panel.

7. The display panel as claimed in claim 5, wherein the light emitting material layer further comprises a quantum dot definition layer located in the pixel definition layer and in the reflective insulation layer; wherein the quantum dot definition layer comprises a positioning through hole, and the quantum dot thin film is located in the positioning through hole.

8. The display panel as claimed in claim 7, wherein the quantum dot thin film comprises:
   a quantum dot material layer;
   a barrier layer attached to two surfaces of the quantum dot material layer paralleling a light output surface of the display panel; and
   a protective layer attached to a surface of the barrier layer away from the quantum dot material layer.

9. The display panel as claimed in claim 8, wherein a surface of the protective layer away from the quantum dot material layer comprises optical micro-nano structures.

10. The display panel as claimed in claim 8, wherein
    a dimension of each of quantum dots in the quantum dot thin film corresponds to a color of light emitted from the light emitting material layer;
    when the light emitted from the light emitting material layer is red, a diameter of each of the quantum dots is greater than or equal to 4 nm;
    when the light emitted from the light emitting material layer is blue, the diameter of each of the quantum dots is less than or equal to 2 nm; and
    when the light emitted from the light emitting material layer is green, the diameter of each of the quantum dots is greater than or equal to 2.5 nm and is less than or equal to 3.5 nm.

11. The display panel as claimed in claim 8, wherein
    the quantum dot material layer comprises a high molecular polymer and quantum dots evenly distributed in the high molecular polymer; and
    the quantum dots comprise silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, or a combination of any two or more thereof.

* * * * *